Figure 1:
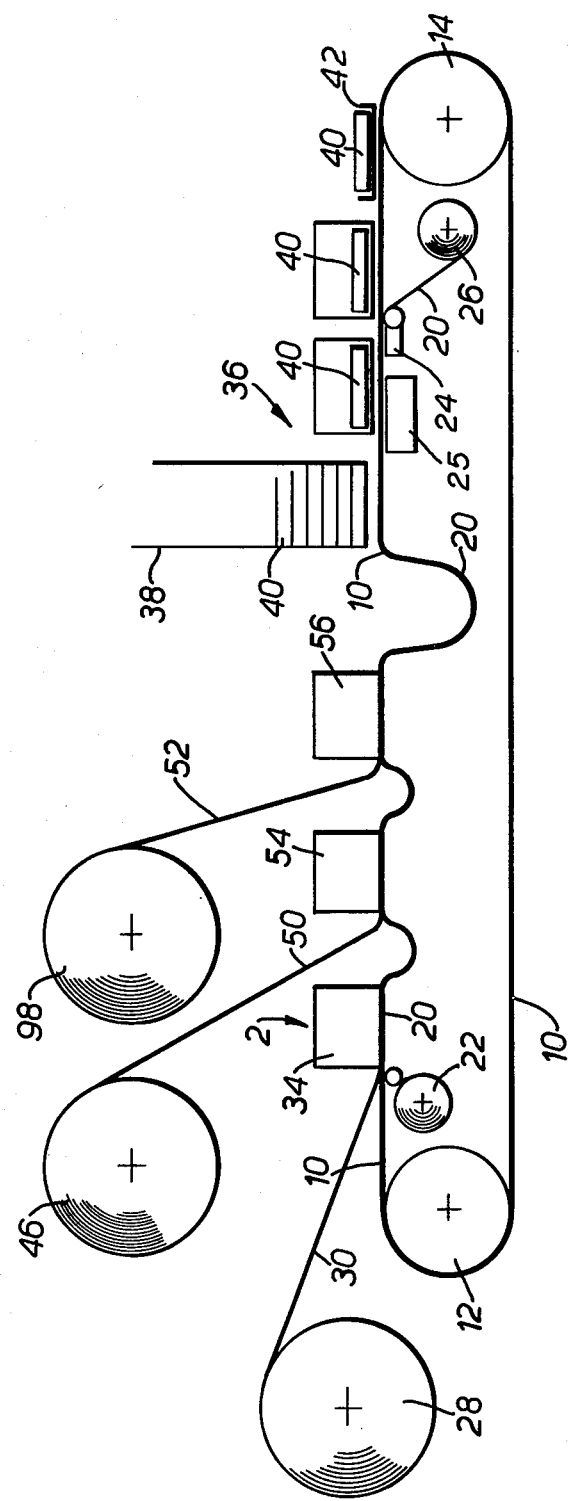

United States Patent [19]

Cullen

[11] 4,452,352
[45] Jun. 5, 1984

[54] APPARATUS FOR LOADING PARTS INTO BODIES

[75] Inventor: Ronald A. Cullen, Brixworth, England

[73] Assignee: Plessey Overseas Limited, Ilford, England

[21] Appl. No.: 259,243

[22] Filed: Apr. 30, 1981

[30] Foreign Application Priority Data

May 3, 1980 [GB] United Kingdom ............... 8014943

[51] Int. Cl.³ ............................................ B65G 47/04
[52] U.S. Cl. ..................................... 198/482; 198/688
[58] Field of Search ........................ 198/688, 482, 480; 29/417, 739, 845

[56] References Cited

U.S. PATENT DOCUMENTS 3,531,861 10/1970 Golbeck ............................... 29/417
3,587,524 6/1971 Keating ............................... 198/688
3,695,414 10/1972 Wiesler et al. ..................... 198/688
4,235,328 11/1980 Marshall ............................. 198/480

Primary Examiner—Joseph E. Valenza
Assistant Examiner—Jonathan D. Holmes
Attorney, Agent, or Firm—Fleit, Jacobson, Cohn & Price

[57] ABSTRACT

A predetermined number of contacts are loaded into a connector body automatically by feeding a predetermined number of contacts on to an indexable strip, the contacts being held on the strip by sticky tape which is engaged by the contacts through slots formed in the strip. The strip transports the contacts to a connector loading station where the predetermined number of contacts are simultaneously loaded into a pre-positioned connector body. The feed rate of the contacts, the index rate of the strip and the connector body positioning mechanism are all controlled by a micro-processor.

11 Claims, 2 Drawing Figures

APPARATUS FOR LOADING PARTS INTO BODIES

This invention relates to apparatus for loading parts into bodies and more particularly to apparatus for loading a predetermined number of parts into a body when there is a requirement that all or some of the bodies have different numbers of parts loaded therein.

By way of example, edge connectors for printed circuit boards usually comprise a plastics body with a plurality of elongate contact strips mounted in the body. The body normally straddles the edge of the P.C.B. and the ends of the contact strips make with conducting portions formed in the edge of the P.C.B. Different P.C.B.'s have different numbers of conducting portions and thus the edge connectors require different numbers of contact strips. The other ends of the contact strips are adapted to be connected to other circuitry such as by wire wrapping or soldering, and sometimes these ends vary in length for reasons of space, ease of connecting to the other circuitry etc.

It is an object of the present invention therefore to provide apparatus which will automatically load parts such as contact strips into a body and which will cater for loading different numbers and types of parts in a single type of body.

According to an aspect of the present invention apparatus for loading parts into bodies comprises an indexable transporting strip having retaining means for retaining the parts thereon, supply means for supplying parts to the retaining means, the rate of suppy being variable whereby the parts are arranged in a predetermined spaced relationship on the transporting strip and loading means for moving the parts from the transporting strip into bodies located adjacent to the transporting strip, the bodies being movable and the transporting strip being synchronously indexable whereby a predetermined number of parts are simultaneously loaded into one of the bodies between each index of the transporting strip.

Figure 2:
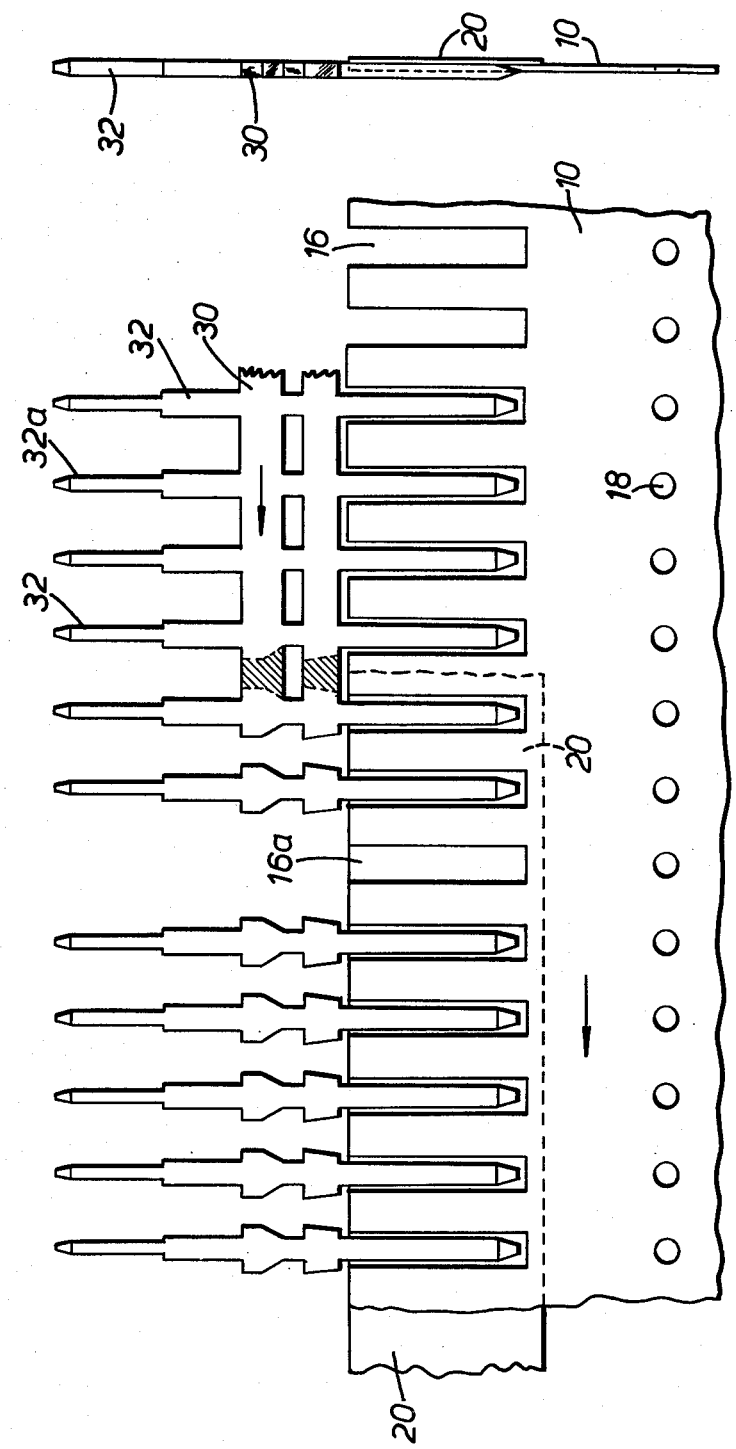

Further aspects of the invention will become apparent from the following description of an embodiment of the invention given by way of example only with reference to the accompanying drawing in which, FIG. 1 is a schematic arrangement of apparatus for loading electrical contact strips into plastic mouldings in accordance with the invention and FIG. 2 is a view of the apparatus as seen from arrow 2 in FIG. 1.

The apparatus comprises a transporting band 10 made up of a closed loop of metal strip which is indexable between rollers 12 and 14. The transporting band has several free loops along its upper run, the purposes of which will be described later. The band is provided along its length with a plurality of equally spaced slots 16 cut out along one edge and is also provided with holes 18 corresponding with the slot 16 for indexing the band.

As the band 10 moves, a strip of adhesive tape 20 is applied to the underside of the band over the slots 16 with its adhesive side uppermost from a reel 22. The adhesive tape 20 is removed from the band by a stripping arm 24 located immediately before the roller 14 and the tape is collected on a second reel 26. The band 10 is indexed at the start of its upper run at a rate of one slot at a time.

Fed from a drum 28 is a continuous strip 30 of contact material, such as a gold plated copper-beryllium alloy, formed into the shape of a plurality of connected elongate contacts.

The partially formed contacts 32 are spaced apart with the same spacing as the slots 16 and the strip 30 is indexed at the same rate as the transporting band 10 so that each partially formed contact 32 joins the band 10 over a slot 16. The band 10 and the strip 30 then pass into a form and crop tool 34 in which each contact is cropped from the continuous strip 30 and simultaneously formed to its finished shape and pressed down on to the band 10 so that it adheres to the adhesive tape 20.

The contacts are then transported on the band 10 to an assembly station 36 where a magazine 38 containing plastics mouldings 40 is located. Each moulding is intended for use as an edge connector for a printed circuit board and the finished connector must therefore be fitted with a predetermined number of contacts depending upon the size of the moulding, the printed circuit board it is to be used with and/or the circuitry to be connected to the board. At the assembly station 36 the adhesive tape 20 is stripped off by stripping arm 24 and the required number of contacts are simultaneously loaded into a moulding 40 by a suitable loading device 25. The moulding is then moved to another position where the contacts are pressed home in the body and are retained therein before the completed connectors are delivered to trays 42.

For loading the contacts into the mouldings the movement of a mounting into the loading position must be accurately synchronized with the arrival of the correct number of contacts and the pushing device must operate between indexing of the band 10 and movement of the moulding so that contacts are not left on the band 10 and subsequently wasted. For supplying different numbers of contacts to a moulding the supply of the strip of contact material 30 from the drum 28 can be stopped, for example, for one indexing of the band 10 after the fifth strip as shown in FIG. 2 where one of the slots 16a has not been supplied with a contact. The strip may in this case also be stopped after the contact 32a for one indexing of the band 10 so that rows of 5 contacts separated by one gap are supplied along the transporting band 10. This arrangement could be used for inserting only five contacts into a moulding intended to have six contacts, the contacts being pushed into the moulding after every six indexing movements of the band 10.

The apparatus may also be used for loading mouldings which have more than one row of contacts, in which case the moulding 40 has to remain at the loading position whilst all the rows are loaded, the moulding being moved up or down after a row has been loaded to align the moulding for the reception of the next set of contacts.

If non-standard numbers of contacts are being loaded into a moulding it may be necessary for maximum efficiency to vary the rate of indexing of the transporting band 10 at the loading end relative to the indexing rate at the contact application end. For this purpose a number of loops 44 are arranged in the transporting band 10 whereby the two indexing rates can be varied within limits, the loops growing larger and smaller as the indexing rates change.

In some cases different length contacts are required in different rows of a connector and this is achieved using additional drums 46 and 48 which provide further strips 50 and 52 which carry different lengths of contact. Additional forming and cropping tools 54 and 56 are provided so that by stopping two of the strips and actuating the third strip any one of three lengths of contact can be supplied on to the transporting band 10.

To actuate the movement of one of the strips 30, 50 and 52 in synchronism with the movement of the band 10 and to synchronize the loading mechanism with the movement of the mouldings 40 and the band 10, a microprocessor (not shown) is used. This can be programmed so that particular numbers and sizes of contact are loaded into the mouldings by the apparatus automatically.

Instead of the continuous metal strip 10, a disposable strip of paper can be used having similar slots and holes to the slots 16 and holes 18. In this case both the paper strip and the adhesive strip would be removed after the assembly operation and disposed of.

What we claim is:

1. Apparatus for loading parts into bodies, said apparatus comprising:
    an intermittently indexable endless transporting strip, said strip being provided with a plurality of spaced slots formed therethrough;
    means for feeding said transporting strip along a predetermined path;
    an adhesive tape;
    means for feeding said adhesive tape into contact with said transporting strip with an adhesive side exposed through said spaced slots;
    means for feeding a continuous strip of connected parts in intermittently indexable relationship with and at the same rate as said transporting strip so that said connected parts are aligned with said slots in said transporting strip;
    means for simultaneously removing parts from said strip of connected parts and pressing them into said slots in said transporting strip between indexing movements of said transporting strip so that said parts adhere to said exposed portions of adhesive tape;
    means for loading said parts into a body between indexing movements of said transporting strip; and
    means for removing said adhesive tape from said transporting strip.

2. Apparatus as claimed in claim 1 in which said transporting strip comprises steel tape.

3. Apparatus as claimed in claim 1 in which said transporting strip comprises paper tape.

4. Apparatus as claimed in claim 2 in which said transporting strip is endless.

5. Apparatus as claimed in claim 3 in which said transporting strip is destroyed after use.

6. Apparatus as claimed in claim 1 in which said transporting strip is indexable one slot at a time.

7. Apparatus as claimed in claim 1 in which the rate of indexing of said continuous strip of connected parts is variable whereby said parts can be arranged in a predetermined spaced relationship on said transporting strip.

8. Apparatus as claimed in claim 7 in which a predetermined number of parts are simultaneously loaded into said body after a predetermined number of indexing movements of said transporting strip.

9. Apparatus as claimed in claim 6 in which said loading means comprises a pushing device adapted to push a plurality of parts at a time from said transporting strip into said body.

10. Apparatus as claimed in claim 9 in which said body is moved after loading to a position in which said parts are further pressed into said body.

11. Apparatus as claimed in claim 1 in which said transporting strip has at least one loop to permit different rates of indexing of the transporting strip at said parts supply position and at said loading means position.

* * * * *